(12) United States Patent
Wang (10) Patent No.: US 11,205,888 B1
(45) Date of Patent: Dec. 21, 2021

(54) ELECTRIC PUSHING ROD WITH WIRE PROTECTION

(71) Applicant: TIMOTION TECHNOLOGY CO., LTD., New Taipei (TW)

(72) Inventor: Chun-Tu Wang, New Taipei (TW)

(73) Assignee: TIMOTION TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 17/004,964

(22) Filed: Aug. 27, 2020

(30) Foreign Application Priority Data

Jul. 30, 2020 (TW) .................................. 109209815

(51) Int. Cl.
| | |
|---|---|
| *H02G 3/04* | (2006.01) |
| *H02K 7/06* | (2006.01) |
| *H02K 5/22* | (2006.01) |
| *H05K 5/02* | (2006.01) |

(52) U.S. Cl.
CPC ........... *H02G 3/0418* (2013.01); *H02K 5/225* (2013.01); *H02K 7/06* (2013.01); *H05K 5/0247* (2013.01)

(58) Field of Classification Search
None
See application file for complete search history.

(56) References Cited

U.S. PATENT DOCUMENTS

| | | | | |
|---|---|---|---|---|
| 3,938,191 | A * | 2/1976 | Jarmy | G11B 7/0025 358/491 |
| 5,758,758 | A * | 6/1998 | Friedrich | B60K 17/02 192/30 W |
| 5,909,751 | A * | 6/1999 | Teagno | B65B 13/027 140/123.6 |
| 5,947,166 | A * | 9/1999 | Doyle | E04G 21/123 140/119 |
| 9,004,519 | B1 * | 4/2015 | Beech | B60D 1/143 280/442 |
| 2002/0008219 | A1 * | 1/2002 | Yokoyama | H02K 7/06 251/129.11 |
| 2006/0163941 | A1 * | 7/2006 | Von Hayn | B60T 8/4077 303/155 |
| 2007/0149328 | A1 * | 6/2007 | Townsend | F16H 19/005 474/101 |
| 2007/0173762 | A1 * | 7/2007 | Estes | A61M 5/1452 604/131 |
| 2010/0314956 | A1 * | 12/2010 | Scott | F16H 61/32 310/80 |
| 2011/0024252 | A1 * | 2/2011 | Kim | F16D 28/00 192/48.2 |

(Continued)

*Primary Examiner* — William H. Mayo, III
*Assistant Examiner* — Krystal Robinson
(74) *Attorney, Agent, or Firm* — Chun-Ming Shih; HDLS IPR Services (57) ABSTRACT

The invention relates to an electric pushing rod with wire protection, which includes a motor, a transmission, a sensor and a wire protector cover. The motor has a body and a shaft. The shaft has a head section and a tail section. Both the head section and the tail section are separately exposed from the body. The transmission is arranged beside the motor. The sensor is disposed correspondingly to the tail section of the shaft and includes a circuit board and conductive wires. The wire protector cover covers the sensor and the tail section of the shaft and is provided with an opening for being passed by the conductive wires. Thereby, the conductive wires are prevented from being broken by touches and friction of the shaft.

10 Claims, 10 Drawing Sheets

(56) References Cited

U.S. PATENT DOCUMENTS

| | | | |
|---|---|---|---|
| 2012/0123395 A1* | 5/2012 | Stoy | A61B 34/72 |
| | | | 606/1 |
| 2014/0305987 A1* | 10/2014 | Parihar | A61B 17/1155 |
| | | | 227/175.2 |
| 2015/0076972 A1* | 3/2015 | Leiber | H02K 7/08 |
| | | | 310/68 B |
| 2018/0133087 A1* | 5/2018 | Xu | A61H 1/0266 |
| 2019/0192245 A1* | 6/2019 | Abbott | A61B 34/00 |
| 2020/0028406 A1* | 1/2020 | Gassner | F16H 1/16 |
| 2020/0129070 A1* | 4/2020 | He | F21V 33/0064 |

* cited by examiner

ELECTRIC PUSHING ROD WITH WIRE PROTECTION

BACKGROUND OF THE INVENTION

Technical Field

The invention relates to electric pushing rods, and particularly to an electric pushing rod with wire protection.

Related Art

Electric pushing rods have been widely used in medical equipment, home beds, massage chairs, exercise equipment, rehabilitation equipment, door openers, window openers, and lifting mechanisms. A conventional electric pushing rod transmits power through a motor and a transmission mechanism. The transmission mechanism includes a worm gear, a leadscrew and an expansion tube. The leadscrew is rotated by the worm gear and the expansion tube is linearly moved by the rotation of the leadscrew.

For precise control to the displacement of the expansion tube, a current electric pushing rod is usually provided with a displacement sensor to detect the displacement of the expansion tube. The displacement sensor is disposed near a rotor of the motor, so the displacement sensor can easily be broken by the touch, winding and/or friction of the rotor.

Also, some electric pushing rods are structurally compact and have limited inner space due to their specific design. When the pushing rod is assembled, no more space is left for wiring. This makes the wires messy and easily broken by touch and friction from gears or other components.

In view of this, the inventors have devoted themselves to the above-mentioned prior art, researched intensively, and cooperated with the application of science to try to solve the above-mentioned problems. Finally, an invention which is reasonable and effective in overcoming the above drawbacks is provided.

SUMMARY OF THE INVENTION

An object of the invention is to provide an electric pushing rod with wire protection, which can prevent conductive wires from being broken by the touch, winding and friction from a shaft.

Another object of the invention is to provide an electric pushing rod with wire protection, which can reserve a space for receiving conductive wires to prevent the conductive wires from being broken by the touch, winding and friction from a gear or other components.

To accomplish the above objects, the invention provides an electric pushing rod with wire protection, which includes a motor, a transmission, a sensor and a wire protector cover. The motor has a body and a shaft. The shaft has a head section and a tail section. Both the head section and the tail section are separately exposed from the body. The transmission is arranged beside the motor and includes a reduction gear set, a leadscrew and an expansion rod. The leadscrew is driven to rotate by the head section of the shaft through the reduction gear set. The expansion rod is screwedly connected with the leadscrew to generate relative linear movement. The sensor is disposed correspondingly to the tail section of the shaft and includes a circuit board and conductive wires. The wire protector cover covers the sensor and the tail section of the shaft and is provided with an opening for being passed through by the conductive wires.

The invention also has the following functions. As the wire pressing cover is installed in the gear box, a space can be reserved in a limited space in the gear box for receiving wires. This can not only fix the wires but also protect the wires from being broken by the gears. A firm positioning effect can be obtained by holding the circuit board with the cover body and hooks. Temperature change of the motor can be measured by the temperature sensing member directly touching the body. The electrostatic conductive members are in direct contact with the metallic sleeve of the body to guide out static electricity, preventing the interference of static electricity.

DETAILED DESCRIPTION OF THE INVENTION

To further disclose the features and technical contents of the invention, please refer to the following description and the drawings. However, the drawings are used for reference and description only, not for limitation to the invention.

Please refer to FIGS. 1-10. The invention provides an electric pushing rod with wire protection, which includes a base 10, a motor 20, a transmission 30, a sensor 40 and a wire protector cover 50.

Figure 7:
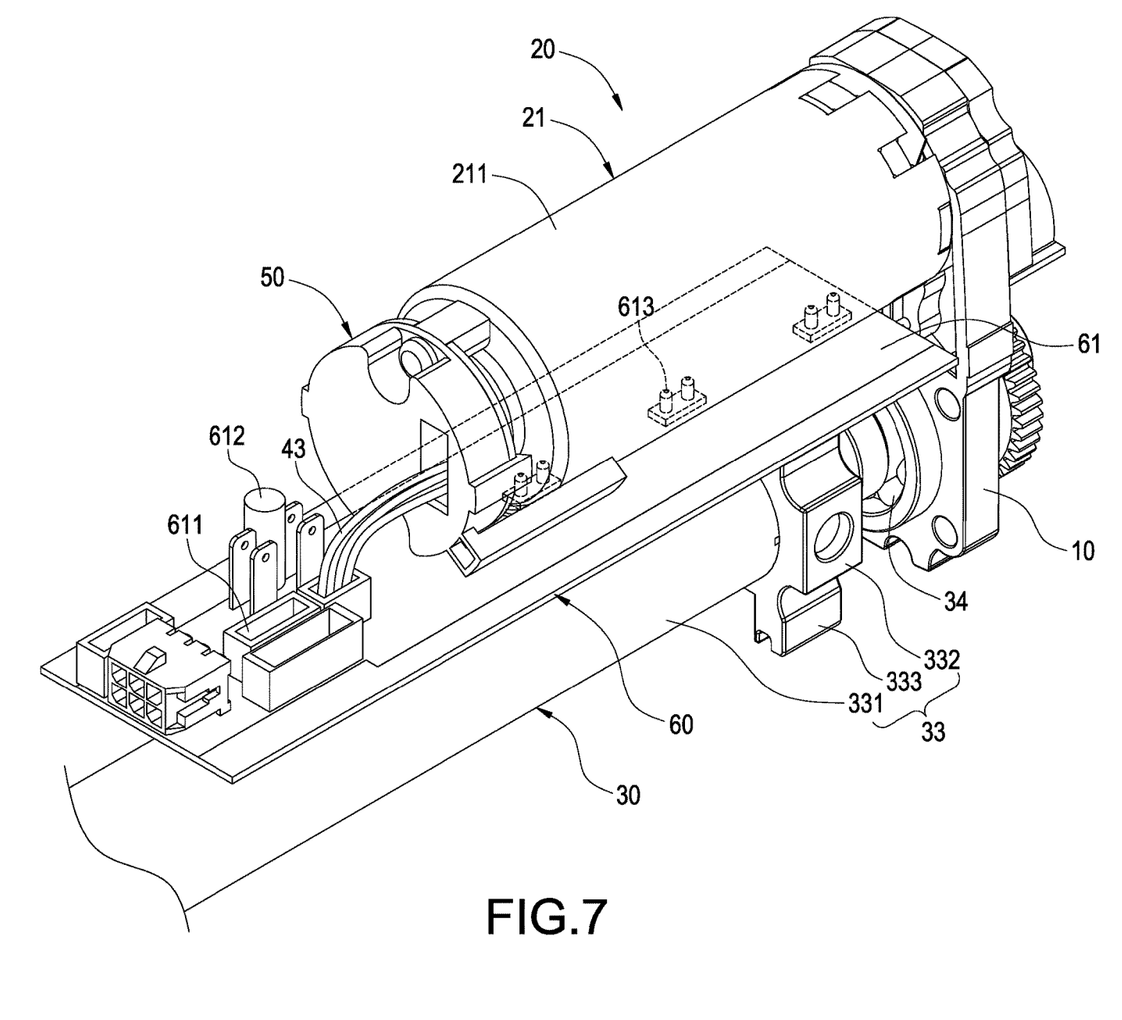
FIG. 7 is an assembled view of the base, the motor, the circuit board and the expansion rod of the invention.
Figure 8:
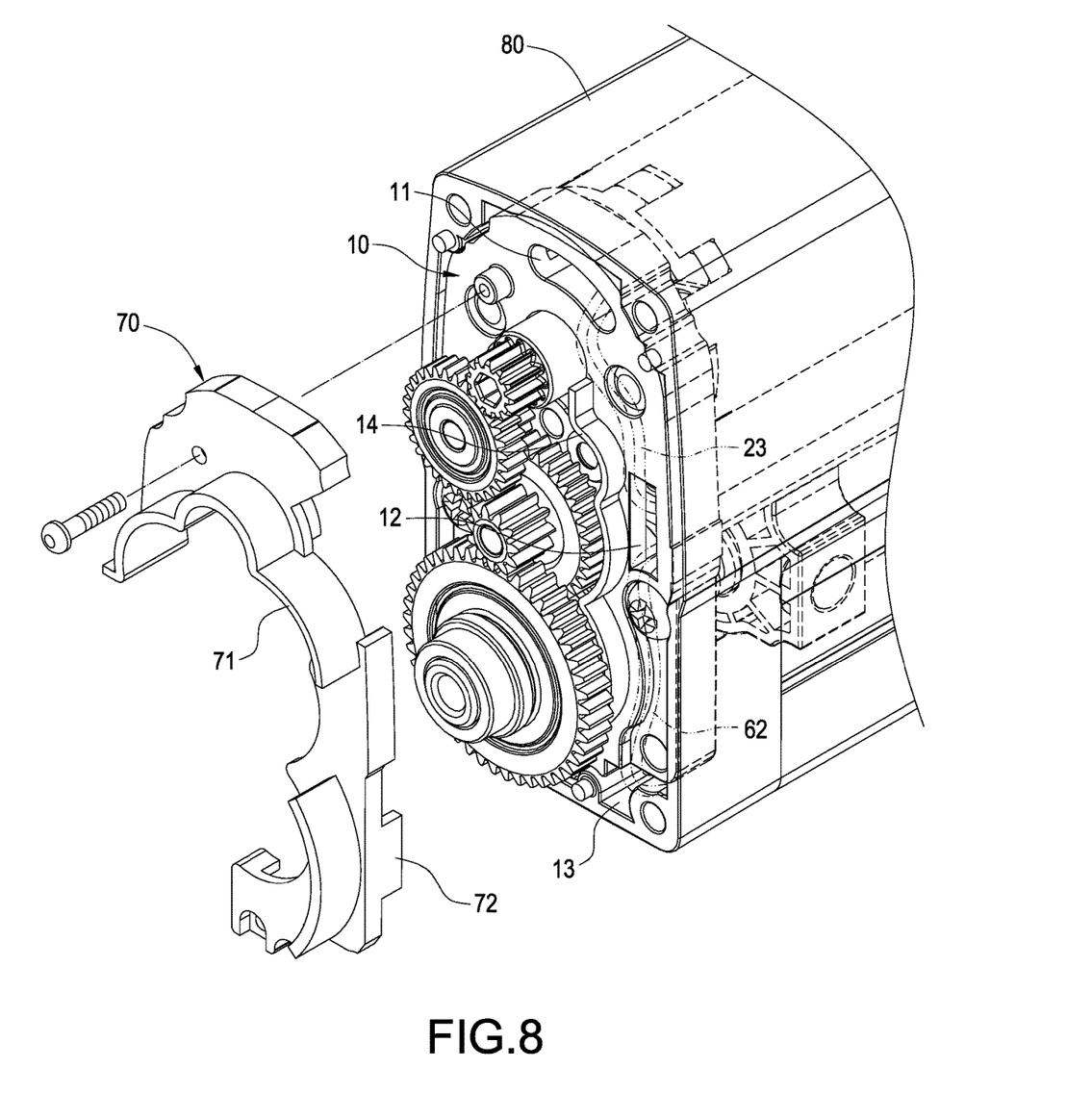
FIG. 8 is an exploded view of the wire pressing cover and the electric pushing rod of the invention.

Please refer to FIGS. 7 and 8 first. The base 10 is made of zinc alloy and is a substantial plate. The base 10 is used to mount the motor 20 and the transmission 30. The top of the base 10 is provided with a first wiring hole 11. A second wiring hole 12 is provided at the right side of the middle of the base 10. A wiring notch 13 is provided at the right side of the bottom of the base 10. Also, a teeth protector 14 is provided near the second wiring hole 12.

Please refer to FIGS. 1-4. The motor 20 is fixed at a side of the base 10 and has a body 21 with a shaft 22 passing though the body 21. The body 21 includes a metallic sleeve 211 in which a stator, a rotor and windings (not shown) are installed. The shaft 22 is connected with the rotor and has a head section 221 and a tail section 223. Both the head section 221 and the tail section 223 are separately exposed from the body 21. In this embodiment, the head section 221 is connected with a driving gear 222. The tail section 223 is connected with a magnetic ring 224. Also, the motor 20 is provided with a motor wire 23 electrically connected to the body 21 and passing through the body 21.

The transmission 30 is fixed on the base 10 and arranged beside the motor 20. The transmission 30 is driven by the motor 20 to rotate and includes a reduction gear set 31, a leadscrew 32 and an expansion rod 33. The reduction gear set 31 is disposed on a side of the base 10, which is separate from the motor 20. The reduction gear set 31 includes gears with different numbers of teeth. One of the gears engages with the driving gear 222. An end of the leadscrew 32 is supported on the base 10 through a bearing 34 (as shown in FIG. 7) and is extended to connect with another gear of the reduction gear set 31.

The expansion rod 33 includes a tube body 331 and a nut 332 connected to the tube body 331. A stopper arm 333 is provided beside the nut 332 to prevent the rotation of the nut 332. The center of the nut 332 is screwed to the leadscrew 32 so as to make the expansion rod 33 linearly stretch or shrink when the leadscrew 32 is driven by the motor 20 and to rotate the transmission 31.

Figure 1:
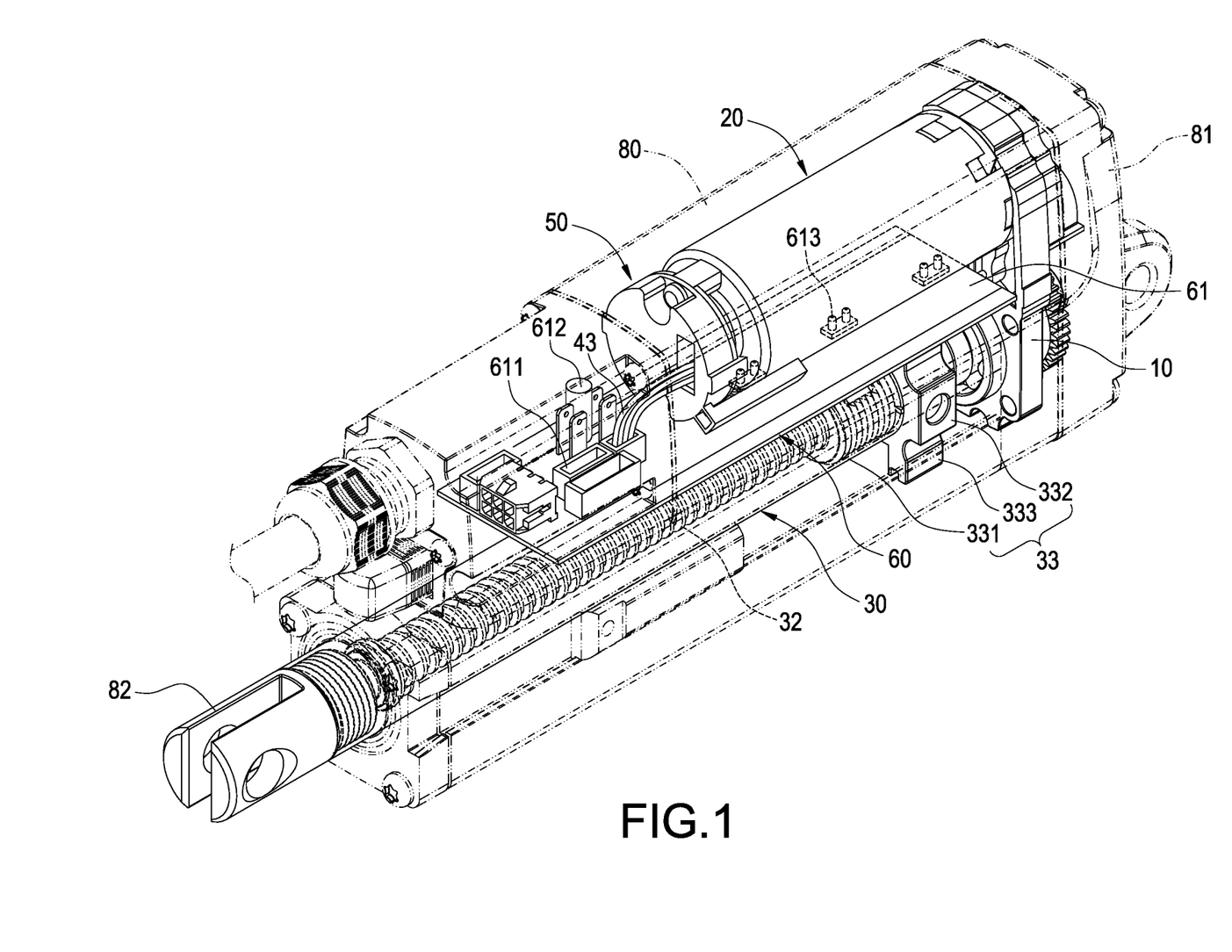
FIG. 1 is a perspective schematic view of the electric pushing rod of the invention.
Figure 2:
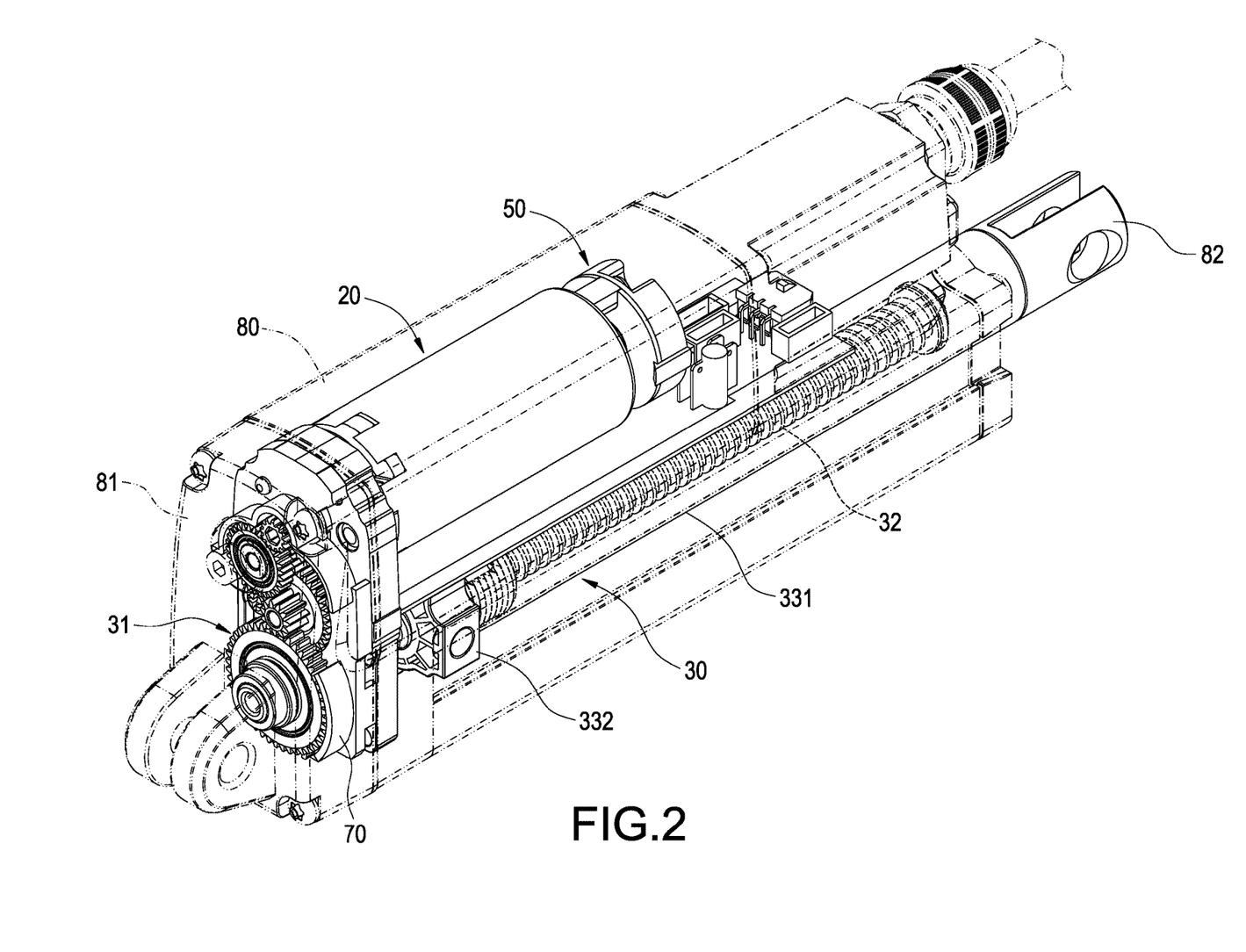
FIG. 2 is another perspective schematic view of the electric pushing rod of the invention.
Figure 3:
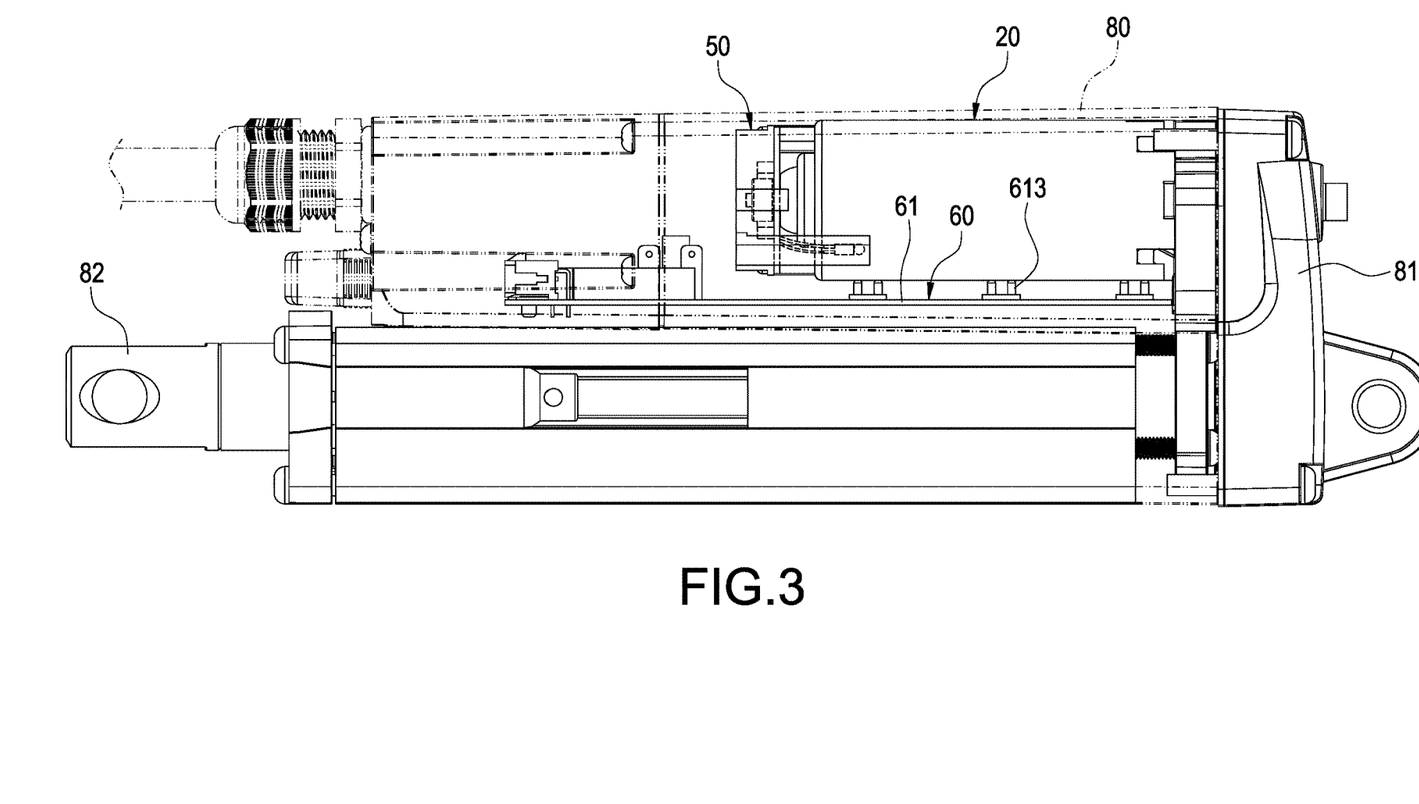
FIG. 3 is a front view of the electric pushing rod of the invention.
Figure 4:
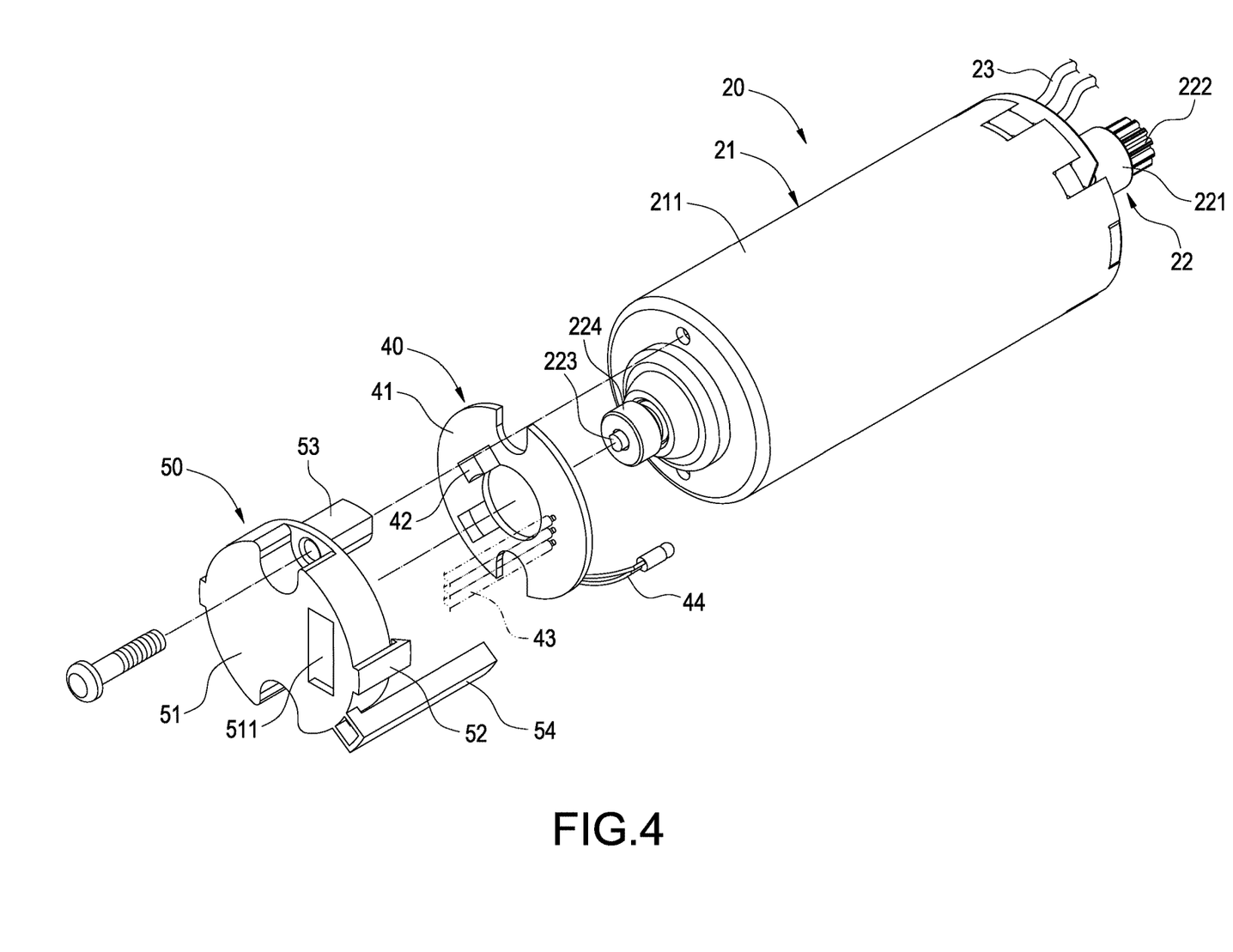
FIG. 4 is an exploded view of the motor, the signal board and the wire protector cover of the invention.
Figure 6:
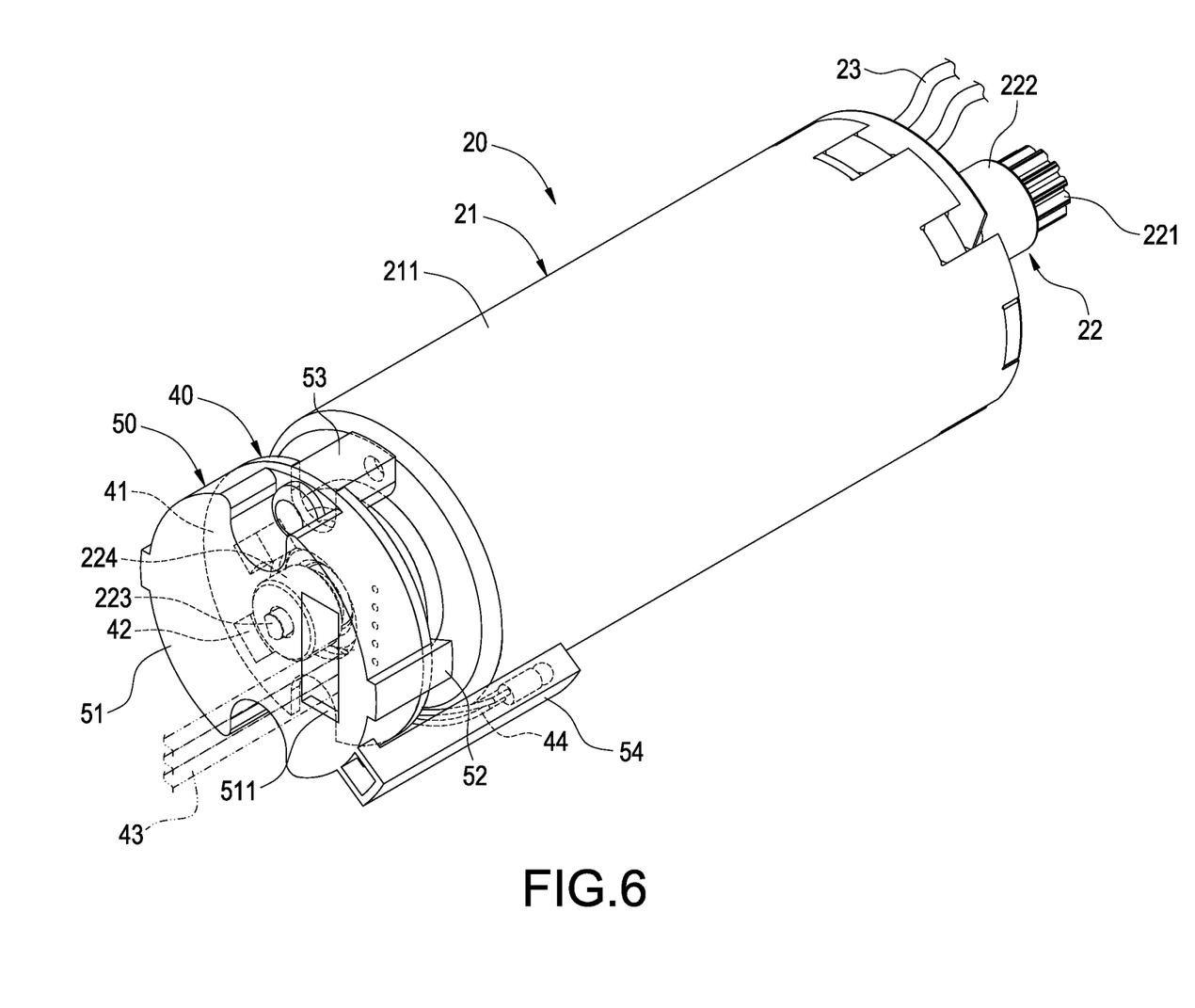
FIG. 6 is an assembled view of the motor, the signal board and the wire protector cover of the invention.

Please refer to FIGS. 4 and 6. In this embodiment, the sensor 40 is a Hall signal board, but is not limited to this. The sensor 40 is arranged correspondingly to the tail section 223 of the shaft 22. The sensor 40 includes a circuit board 41, two sensing units 42 and conductive wires 43. The sensing units 42 are electrically connected to the circuit board 41 and are arranged apart from each other. The sensing units 42 are formed outside the magnetic ring 224 to sense a change in magnetic field and converting the change in magnetic field into change of voltage. An end of each conductive wire 43 is connected to the circuit board by soldering to form an electrical connection.

Figure 5:
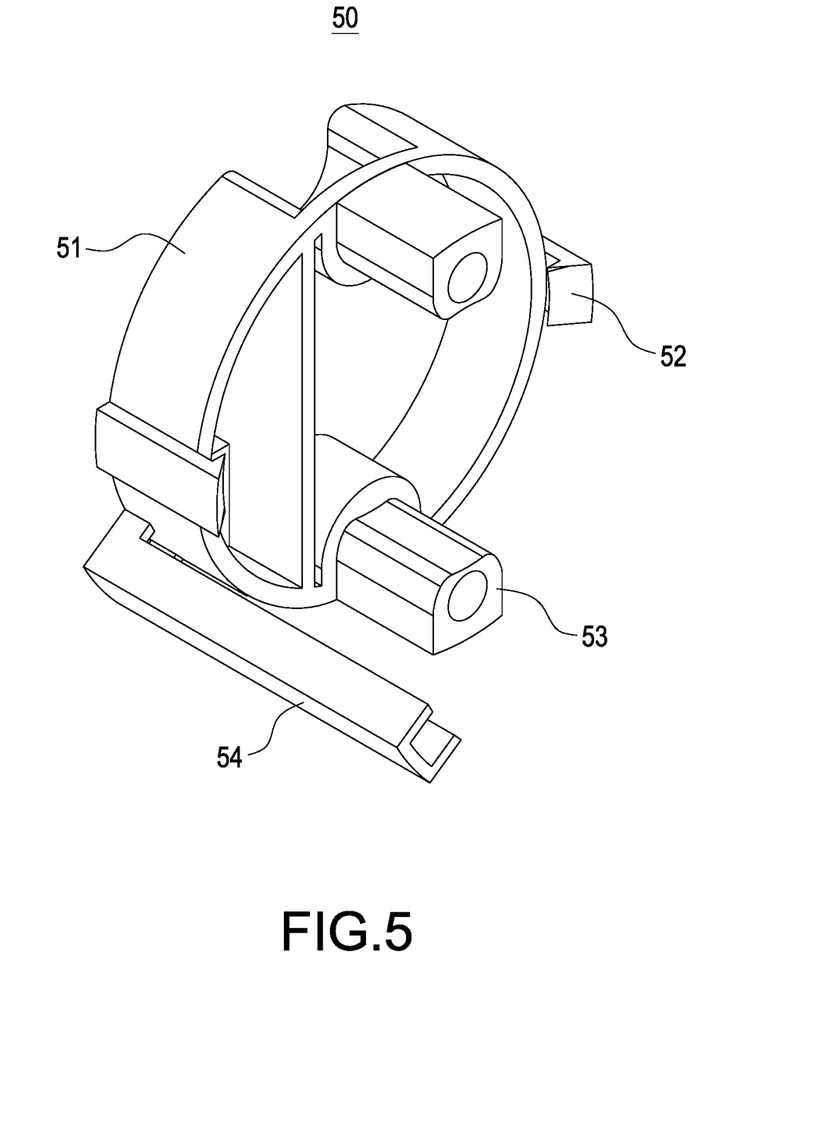
FIG. 5 is a perspective view of the wire protector cover of the invention.

Please refer to FIGS. 4-6. The wire protector cover 50 is fixed to the body 21 and covers the sensor 40 and the tail section 223 of the shaft 22. The wire protector cover 50 includes a cover body 51, two hooks 52, two support bars 53 and a pressing arm 54. The cover body 51 is of a circular shape. The hooks 52 are downward extended from a periphery of the cover body 51. The support bars 53 project from the bottom of the cover body 51. The pressing arm 54 is downward extended from a periphery of the cover body 51 and between the hooks 52 and the support bars 53. The cover body 51 is provided with an opening 511 near the hooks 52 and the pressing arm 54. Ends of the conductive wires 43, which stand apart from the circuit from the circuit board 41 pass through the opening 511 to prevent the conductive wires 43 from being broken by friction from the tail section 223 of the shaft 22.

Further, the circuit board 41 is fixed between the cover body 51 and the hooks 52. When the wire protector cover 50 is being fixed to the body 21, fasteners pass through the support bars 53 to be fastened to the body 21. Thus, the sensing units 42 are arranged outside of the magnetic ring 224 to measure position and rotation speed.

Further, in this embodiment, the sensor 40 includes a temperature sensing member 44 electrically connected to the circuit board 41. The temperature sensing member 44 touches the metallic sleeve 211 of the body 21 by being pressed by the pressing arm 54. Thus, the temperature of the body 21 can be measured by the temperature sensing member 44 directly touching the metallic sleeve 411.

Please refer to FIG. 7. The electric pushing rod with wire protection of the invention further includes a control module 60, which includes a main circuit board 61 disposed between the motor 20 and the expansion rod 33. The main circuit board 61 is provided with connecting ports 611, electronic components 612 and at least one electrostatic conductive member 613. In this embodiment, the electrostatic conductive member 613 is multiple in number. The electrostatic conductive members 613 are in direct contact with the metallic sleeve 211 of the body 21 to guide out static electricity to prevent the interference of static electricity.

Figure 9:
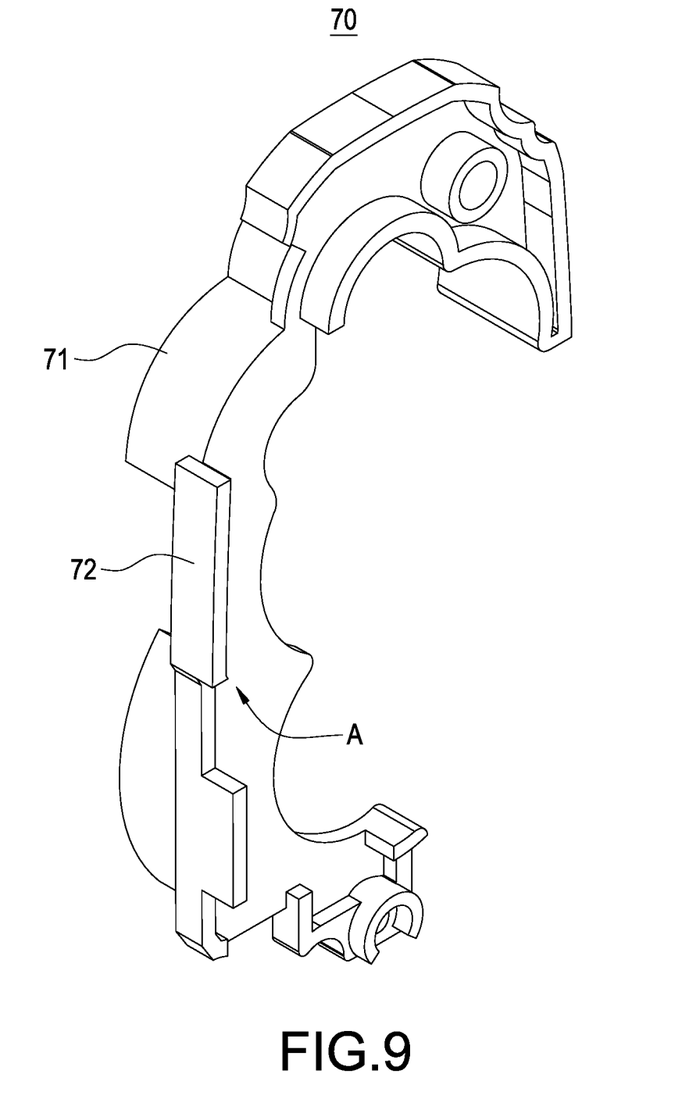
FIG. 9 is a perspective of the wire pressing cover of the invention.
Figure 10:
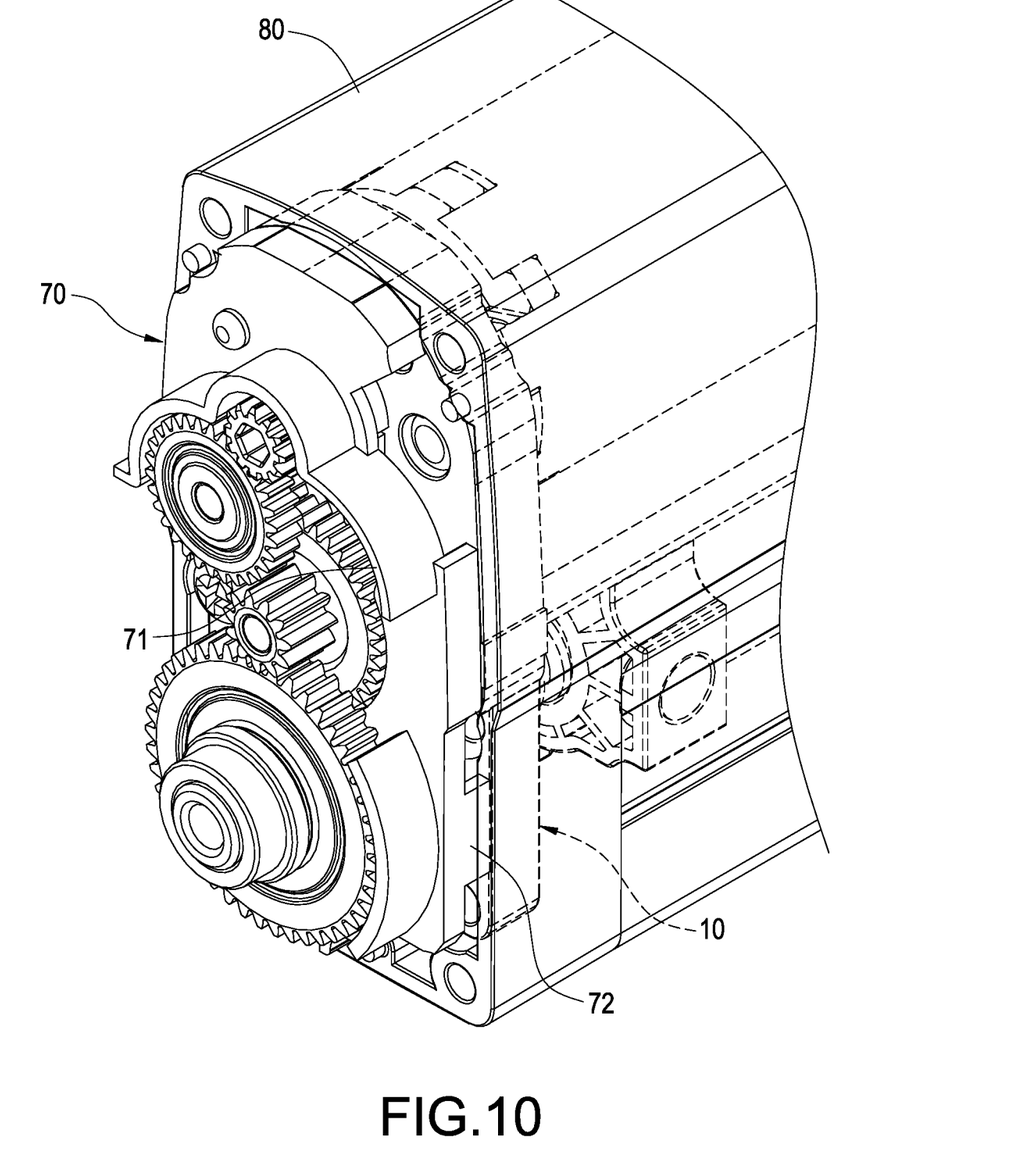
FIG. 10 is a schematic view of the wire pressing cover assembled to the electric pushing rod of the invention.

Please refer to FIGS. 8-10. The electric pushing rod with wire protection of the invention further includes a wire pressing cover 70 which is fixed on the base 10 and arranged beside the reduction gear set 31. The wire pressing cover 70 includes a teeth wall 71 surrounding the reduction gear set 31 and a wire wall 72 connected to a side of the teeth wall 71. A wiring trough A is defined between the teeth wall 71, the wire wall 72 and the teeth protector 14. The control module 60 further includes a limit switch wire 62 which is electrically connected to the main circuit board 61, passes through the second wiring hole 12 to project from the base 10, and then enters the wiring notch 13 along the wiring trough A to be arranged beside the expansion rod 33. The motor wire 23 passes out of the base 10 through the first wiring hole 11 and enters the second wiring hole 12 along the wiring trough A to electrically connect with the main circuit board 61.

Also, the electric pushing rod with wire protection of the invention further includes a housing 80, a rear support 81 and a front support 82. The housing 80 covers the base 10, the motor 20, the transmission 30, the sensor 40 and the wire protector cover 50. The rear support 81 covers and connects a rear end of the housing 80. The front support 82 connects an end of the expansion rod 33 and is exposed at a front end of the housing 80.

It will be appreciated by persons skilled in the art that the above embodiment has been described by way of example only and not in any limitative sense, and that various alterations and modifications are possible without departure from the scope of the invention as defined by the appended claims.

What is claimed is:

1. An electric pushing rod with wire protection, comprising:
   a motor, having a body and a shaft, the shaft having a head section and a tail section, and both the head section and the tail section being separately exposed from the body;
   a transmission, arranged beside the motor, comprising a reduction gear set, a leadscrew and an expansion rod, the leadscrew being driven to rotate by the head section of the shaft through the reduction gear set, and the expansion rod being screwedly connected with the leadscrew to generate relative linear movement;
   a sensor, disposed correspondingly to the tail section of the shaft, and comprising a circuit board and conductive wires electrically connected to the circuit board; and
   a wire protector cover, covering the sensor and the tail section of the shaft, and being provided with an opening for being passed through by the conductive wires.

2. The electric pushing rod of claim 1, wherein the wire protector cover is fixed to the body, the wire protector cover comprises a cover body, hooks and support bars, the opening is disposed in the cover body, the hooks are extended from the cover body, the support bars project from the cover body, and the circuit board is fixed between the cover body and the hooks.

3. The electric pushing rod of claim 2, wherein the wire protector cover comprises a pressing arm 54 extended from the cover body, the sensor comprises a temperature sensing member electrically connected to the circuit board, and the temperature sensing member is touched to the body by the pressing arm.

4. The electric pushing rod of claim 1, wherein the sensor comprises sensing units, the sensing units are electrically connected to the circuit board and are arranged apart from each other, the tail section is connected with a magnetic ring, and the sensing units are formed outside the magnetic ring.

5. The electric pushing rod of claim 1, further comprising a base mounted by the motor and the transmission.

6. The electric pushing rod of claim 5, further comprising a wire pressing cover which is fixed on the base and a teeth protector provided near the reduction gear set, wherein the wire pressing cover comprises a teeth wall surrounding the reduction gear set and a wire wall connected to a side of the teeth wall, and a wiring trough is defined between the teeth wall, the wire wall and the teeth protector.

7. The electric pushing rod of claim 6, further comprising a control module, wherein the control module comprises a main circuit board disposed between the motor and the expansion rod.

8. The electric pushing rod of claim 7, wherein the base is provided with a first wiring hole and a second wiring hole, the motor has a motor wire, and the motor wire passes out of the base through the first wiring hole and enters the second wiring hole along the wiring trough to electrically connect with the main circuit board.

9. The electric pushing rod of claim 8, wherein the base has a wiring notch, the control module comprises a limit switch wire which is electrically connected to the main circuit board, passes through the second wiring hole to project from the base, and then enters the wiring notch along the wiring trough to be arranged beside the expansion rod.

10. The electric pushing rod of claim 7, wherein the body of the motor comprises a metallic sleeve, the main circuit board is provided with at least one electrostatic conductive member, and the electrostatic conductive member is in direct contact with the metallic sleeve.

* * * * *